United States Patent
Roden et al.

(10) Patent No.: US 6,528,960 B1
(45) Date of Patent: Mar. 4, 2003

(54) COST EFFECTIVE MEASUREMENT OF HIGH CURRENTS

(75) Inventors: Garey George Roden; Mark William Basselgia, both of Apalachin, NY (US)

(73) Assignee: BAE Systems Controls, Inc., Johnson City, NY (US)

( * ) Notice: Subject to any disclaimer, the term of this patent is extended or adjusted under 35 U.S.C. 154(b) by 25 days.

(21) Appl. No.: 09/708,111

(22) Filed: Nov. 8, 2000

(51) Int. Cl.$^7$ ............................................. H02P 5/40
(52) U.S. Cl. ........................ 318/254; 318/811; 324/126; 361/31
(58) Field of Search .................................. 318/138, 254, 318/268, 801, 806, 811; 324/126; 361/31, 58

(56) References Cited

U.S. PATENT DOCUMENTS

| | | | |
|---|---|---|---|
| 4,973,937 A | * 11/1990 | Weinstein et al. | 324/126 |
| 5,552,685 A | * 9/1996 | Young et al. | 318/254 |
| 5,825,597 A | * 10/1998 | Young | 361/31 |

* cited by examiner

*Primary Examiner*—Khanh Dang
(74) *Attorney, Agent, or Firm*—William H. Meise; Geoffrey H. Krauss

(57) ABSTRACT

The increasing use of vehicles powered completely or in part by electric motors has created a need for measuring high currents in an inexpensive, reliable and convenient manner for digital motor control. Because the operating voltages of traction motors may be high, it is desirable that the motor current sensors be noncontacting. High-current sensors are commercially available, but tend to be large and costly. According to an aspect of the invention, a noncontacting current sensor having a rated capacity significantly less than the motor (or other) current to be measured is coupled to an electrical conductor for sensing the current in that conductor. The electrical conductor is paralleled by one or more additional similar conductors, so that only a fraction or portion of the current to be measured flows through the conductor associated with the sensor. The current sensor elements may be mounted on a printed-circuit board, which supports the elements, and also has one or more printed patterns which define a conductor associated with the sensor and at least one other conductor through which current can flow in parallel with the current in the sensor.

9 Claims, 5 Drawing Sheets

COST EFFECTIVE MEASUREMENT OF HIGH CURRENTS

FIELD OF THE INVENTION

This invention relates to the measurement of relatively large currents, namely those in the range of a hundred or so amperes to at least several thousands of amperes, especially in the context of motor controllers for electrically powered vehicles.

BACKGROUND OF THE INVENTION

Electrically powered vehicles have recently become more important as environmental concerns grow. A problem with electrically powered vehicles is that with current technology, vehicle range is limited to an extent that many users find inconvenient. The use of hybrid internal-combustion/electric vehicles has been proposed in order to address the problem of limited range, and such vehicles are beginning to find use. Another problem with electrically powered or partially electrically powered vehicles is that the technology is not well developed for storing large amounts of electrical energy as may be required, and for controllably converting the energy so stored into usable vehicle traction motor current.

Many electrical power and drive schemes have been proposed and tried. Many of these techniques rely on microprocessor- or digital-signal-processor-controlled controllers, which perform sophisticated analyses for generating the desired control signals which, in turn, control the application of relatively large traction currents to the vehicle traction motor. Among these sophisticated control schemes are the field-oriented-control (FOC) applied to induction traction motors. Sophisticated controllers generally require substantial information about the vehicle operator commands, the state of the battery charge, the vehicle speed, and the motor current or currents, in the context of multiphase or polyphase motors. Such controllers may also provide for dynamic braking, in which vehicle kinetic energy is returned to the traction battery concurrently with braking. The controllers may also control the operation of an internal combustion engine in the case of hybrid electric vehicles.

As mentioned, the technology is not well developed for operation of vehicle motors from traction storage batteries or from the newer ultracapacitors which may be used for electrical energy storage. For example, battery voltages are in direct-voltage (DC) form, and the traction power may be such as to require currents currently in the range of up to one thousand amperes, but which may be larger in the future. Handling currents in the hundreds or thousands of amperes has long been known, but principally in a laboratory setting. In a laboratory, it is easy to handle such large currents by the use of machined bus bars and large cables. Generally, however, the types of devices used in laboratory settings are not directly usable in the context of a vehicle, where light weight, reliability under adverse weather and operating conditions, and low cost are important factors.

SUMMARY THE INVENTION

A device for determining electrical current according to an aspect of the invention includes a current sensing apparatus. The current sensing apparatus includes a first electrical path through which a current to be sensed passes. The current sensing apparatus is capable of producing a sensed signal in response to the current in the first electrical path, up to a predetermined maximum value of the current in the first electrical path, above which maximum value of current the sensed signal is limited. First and second terminals are coupled to ends of the first electrical path, whereby, or as a result of which, the current sensing apparatus produces the sensed signal in response to current flowing between the first and second terminals, at least up to the predetermined maximum value. The device further includes a second electrical path extending between the first and second terminals. The second electrical path is effectively in electrical parallel with the first electrical path, so that a portion of current flowing between the first and second terminals flows through the second electrical path rather than through the first electrical path. As a result of this division, the unlimited portion of the sensed signal represents a current between the first and second terminals which is greater than the current above which the current sensing apparatus limits. In a particularly advantageous embodiment of the invention, the current sensing apparatus is noncontacting or isolated as between the first current sensing path and that port at which the sensed signal is generated.

According to another aspect of the invention, a vehicle is powered at least in part by an electric motor. The vehicle comprises a rotational vehicle drive device such as a wheel or a cog. A motor is coupled to the rotational vehicle drive device, for driving the vehicle when the motor drives the rotational vehicle drive device. The vehicle also includes a source of electrical energy; in the context of a purely electrically driven vehicle, this might be the traction battery, or in the context of a hybrid electric vehicle, it might include the traction battery, a generator, or both. An electrical power path extends between the source of electrical energy and the motor. The electrical power path including a controllable electrical power control arrangement, for controllably coupling electrical energy between the source of electrical energy and the motor. In an FOC system, the controllable electrical power control arrangement may be a set of power switches operated by a digital controller. In a direct-current system, the power controller might be as simple as a rheostat. A control circuit is coupled to the controllable electrical power control arrangement, for responding to at least operator control signals and motor current signals, for controlling the motor for driving the vehicle under operator control. A current sensing apparatus is located in the electrical power path, for sensing at least one component of motor current. In the context of a simple direct voltage source and motor, the main motor current is sensed, while in the context of FOC control, all the motor currents but one are sensed. The current sensing apparatus has a maximum rated sensed current or maximum motor current component for which a nonlimited sensed signal representative of the motor current component is generated. A resistive shunt parallels the current sensing apparatus, for shunting at least a portion of the motor current component around the current sensing apparatus. In one embodiment of this version, the resistive shunt comprises a multistrand electrically conductive cable. In another embodiment of this version, the resistive shunt comprises a bus bar. In yet another embodiment of this version, the current sensing apparatus includes a printed-circuit board including an electrically conductive path broken at a break location, together with a commercial current sensor coupled across the break in the current path, for generating the sensed signal representative of the motor current component; in this embodiment, the resistive shunt comprises a further electrically conductive portion of the printed-circuit board. In a preferred embodiment of this version, the current sensing apparatus is a noncontacting current sensing apparatus.

According to another aspect of the invention, an arrangement for determining electrical current comprises a current sensing apparatus. The current sensing apparatus including a first electrical path through which a current to be sensed passes. The current sensing apparatus is capable of producing a sensed signal at a sensed signal port in response to the current in the first electrical path, up to a rated maximum value of the current in the first electrical path. In this aspect of the invention, first and second terminals or electrodes are coupled to ends of the first electrical path, whereby the current sensing apparatus produces the sensed signal in response to current flowing between the first and second terminals or electrodes. A second electrical path extends between the first and second terminals, so that the second electrical path is effectively in parallel with the first electrical path. As a result of these arrangements, a portion of the current flowing between the first and second terminals flows through the second electrical path rather than through the first electrical path, whereby the total current flowing between the first and second terminals is greater than the current flowing in the first electrical path, whereby the current sensing apparatus senses less than the total current flowing between the first and second terminals. In a particularly advantageous version of this aspect of the invention, the current sensing apparatus is noncontacting as between the first electrical path and sensed signal port.

BRIEF DESCRIPTION OF THE DRAWING

FIG. 3b is a plan view of the pattern of the upper printed conductor of the board of FIG. 3a, and FIG. 3c is a plan view of the pattern of the lower printed conductor of the board of FIG. 3a;

DESCRIPTION OF THE INVENTION

Figure 1:
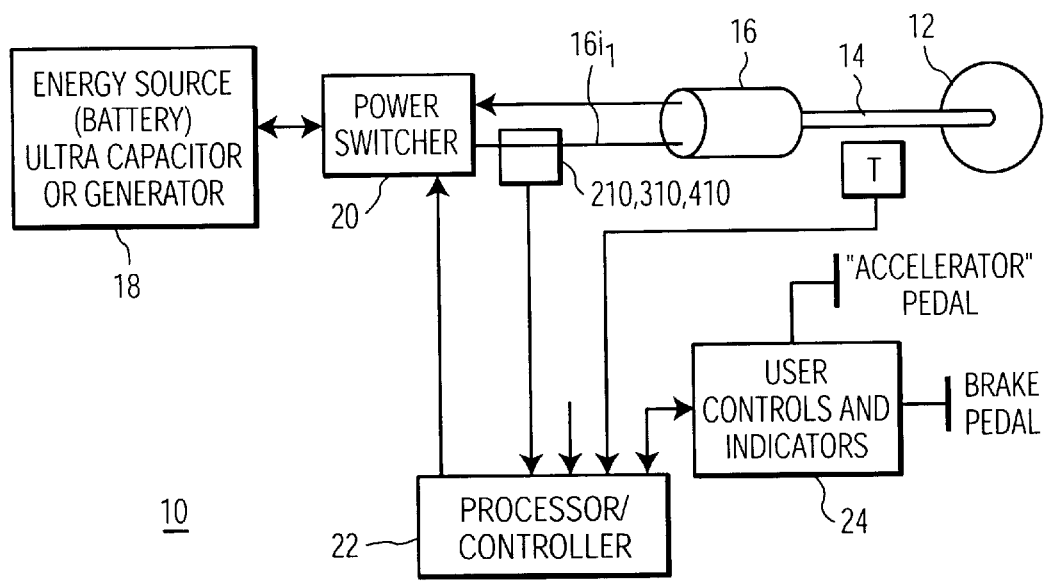
FIG. 1 is a simplified block diagram of a portion of an electrically driven vehicle.

In FIG. 1, a vehicle designated generally as 10 includes a rotational vehicle drive device illustrated as a wheel 12. Wheel 12 is mechanically coupled by way of a mechanical coupling 14 to a motor 16. Vehicle 10 also includes a source 18 of electrical energy or power, which may be, for example, an electrochemical battery or a generator driven by a prime mover, or may possibly be an ultra-high-capacity capacitor. Energy source 18 is coupled to motor 16 by means of a power-controlling device illustrated as a switcher block 20. Switcher block 20 controls the application of electrical energy or power to motor 16 under the control of a controller, processor or digital signal processor (DSP) 22. Controller 22 responds to user command signals such as braking signals and "accelerator" or "throttle" signals from the user. The origin of such user signals is illustrated as a block 24.

As so far described, vehicle 10 of FIG. 1 is generic, in that the description is generally applicable to all "series" vehicles which are at least partially powered by electricity. One sophisticated type of electric vehicle control is the field-oriented control (FOC). Field-oriented control can be used with at least induction motors. Field-oriented controllers make use of a great deal of information relating to the vehicle operation, including operator control input signals, signals representing the motor current, bus, electrical source, or motor drive voltage, and, if battery condition is to be monitored and maintained, battery current, temperature and the like. In FIG. 1, a resolver (R) is illustrated as being coupled to mechanical drive coupling 14, for generating a motor or wheel speed signal for application to the controller 22. In actual practice the motor rotor position is derived from the resolver. The motor velocity and acceleration may then be calculated from the change in position as a function of time. In addition to the resolver input signals, controller 22 of FIG. 1 receives at least one signal from a current sensor C coupled to measure the electrical current in a motor power conductor $16i_1$. In the case of a polyphase motor, a motor current signal may be received by controller for all but one of the motor power conductors, and the current in the last, unmeasured power conductor can be calculated from the remaining currents. The measurements of motor current and bus voltage allows the motor power and power direction (for dynamic braking) to be calculated.

Since the motor performance and control is determined, at least in part, from measurements of current, it is important that the currents so measured be accurate. This is particularly so in the case in which a polyphase motor is used, because the calculations may include taking the differences between or among the various currents. If the sensors are not very accurate, the calculated differences may be very inaccurate.

Figure 5:
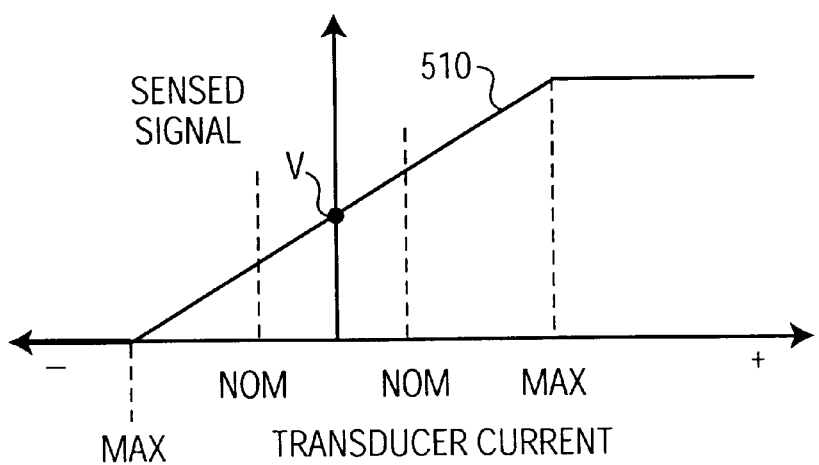
FIG. 5 is a simplified representation of the characteristics of a particular type of noncontacting current sensor, illustrating its limiting characteristic.

As mentioned, the currents drawn by the traction motor in a vehicle context may be hundreds or even thousands of amperes in magnitude. Resistive current sensors such as a series resistor and associated voltameter are not practical, because of the effect of the heating losses caused by the flow of the motor current through the resistance on the fuel economy or range of the vehicle, and also because the varying current in the resistor results in a change in its resistance, requiring some sort of calibration to maintain accuracy. An additional disadvantage of simple resistive current sensors is that they are not electrically isolated, so the bus voltage source is coupled to the system controller, which can undesirably couple dangerous or damaging voltages to the controller under certain circumstances. Commercial current measuring devices capable of accurately measuring currents in the range of hundreds and thousands of amperes are available, but are expensive. Among such sensors are "closed loop" current transducers such as type LT 505-S/SP8, manufactured by LEM Business Area Components, 8, Chemin des Aulx, CH-1228 Plan-les-Ouates, Switzerland, which also has offices in the U.S. at 27 RT 191A, PO Box 1207, Amherst, N.H. 03031. Other versions of this type of transducer which are available at relatively small cost are the type LTS 25, which have a nominal current capacity of 25 amperes. In addition, other inexpensive current transducers of the "open-loop" type are available. These tend to be less accurate than the "closed-loop" type, and are subject to unwanted noise signals. Plot 510 of FIG. 5 illustrates the characteristic of the nominal 25-amp rated LTS 25. In FIG. 5, the sensed signal at zero transducer current is at a finite value V, which corresponds to about 2½ volts, which is half of the energizing voltage of 5 volts. Signal output greater than 2½ volts represents "positive" current directions, and signal outputs less than 2½ volts represent "negative" currents. As illustrated, the nominal (NOM) transducer current is not the value at which the sensed current is limited, but rather lies near the center of each side of the plot; the NOM value for the LTS 25 is 25 amperes. The sensor output signal limits in both the positive and negative directions at a value of current which is designated "max." In the case of the LTS 25, these correspond to about 80 amperes.

According to an aspect of the invention, the sensing of the motor current in an electrically powered vehicle is performed by a current sensing arrangement including a commercial current sensor capable of measuring a maximum current much smaller than the peak motor current, together with a current dividing scheme which allows most of the motor current in any particular phase to flow to the motor without measurement, and which passes only a fraction of the motor current of that phase through the current sensor.

Figure 2A:
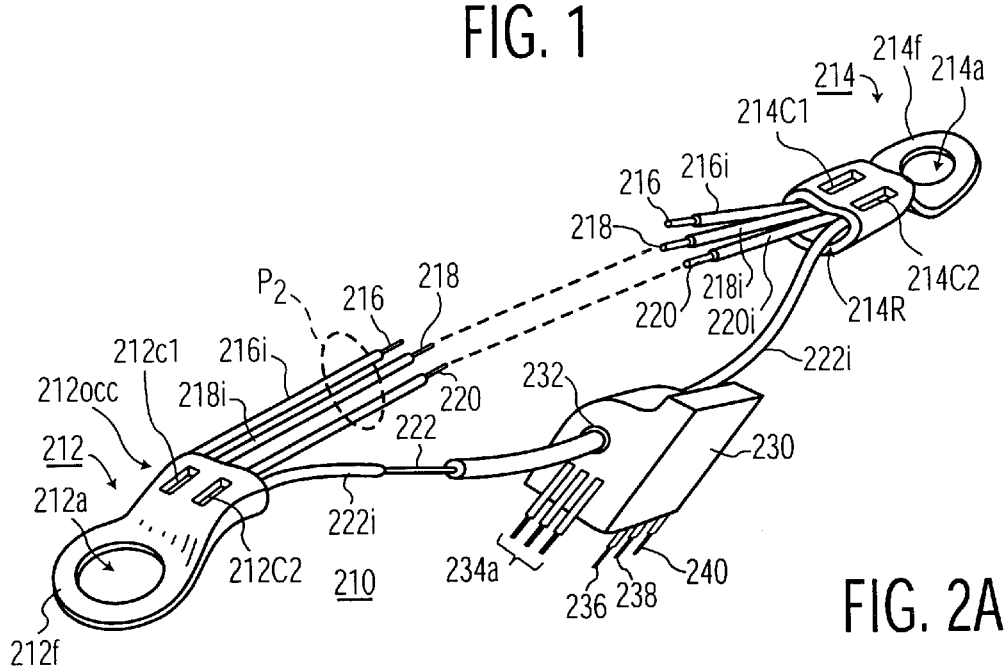
FIG. 2a is a perspective or isometric view of a current measuring arrangement according to an aspect of the invention, which may be used in the vehicle of FIG. 1.

In FIG. 2a, one embodiment of a current sensor arrangement 210 suitable for use for measuring motor current in one form of electrically powered vehicle. In FIG. 2a, arrangement 210 includes a first lug, terminal or electrode 212 which is made from a conductive material such as plated copper. Lug 212 includes a flat portion 212f defining an aperture 212a dimensioned to clear a screw or bolt for fastening the lug to a further electrical conductor. In addition to flat portion 212a, lug 212 includes an offset conductor-clamping portion 212occ. Conductor-clamping portion 212occ defines a receptacle (not visible in FIG. 2a) into which the ends of electrical conductors or wires 216, 218, 220, and 222 are placed. The ends of electrical conductors 216, 218, 220, and 222 are crimped in place and forced into intimate electrical contact with the conductor-clamping portion 220occ by a pair of crimps or indentations 212c1 and 212c2. As illustrated, each electrical conductor 216, 218, 220 and 222 is insulated by an insulating layer 216i, 218i, 220i, and 222i. As also illustrated in FIG. 2a, the remote ends of wires 216, 218, 220, and 222 are inserted into a receptacle 214R in an offset conductor clamping portion of a lug 214, and are crimped in place to provide good electrical contact by a pair of crimps or indentations 214c1 and 214c2. Lug 214 also includes a flat portion 214f which defines an aperture 214a.

In FIG. 2a, a commercially available current transducer having a 25 ampere nominal non-limiting range is illustrated as 230. The particular type of transducer which is illustrated is the abovementioned type LTS 25. Conductor 222 extends through an aperture 232 in the transducer 230 in a noncontacting or isolated manner. Transducer 230 also includes pins 236, 238, and 240, by which energization potential can be applied to the transducer and signal output can be extracted from the transducer. As with the terms "between" and "parallel," the term "noncontacting" is used in an electrical rather than a mechanical sense.

For purposes of this invention, the term "noncontacting" means that an electrical insulator (which may include free space) lies between the electrical conductors which are noncontacting, so that the current flow in one is, as a practical matter, unaffected by the voltage on the other. In essence, the term means that a high resistance is interposed between, or lies between, the electrical conductors in question, where the dimension corresponding to "high" depends upon the impedances of the two noncontacting circuits and the amount of allowable interaction.

Those skilled in the art know that electrical current can flow only in a complete circuit, which implies that existence of a single current through a device involves a two-wire connection to the device, one for current "into" the device, and another for "output" current.

Transducer 230 of FIG. 2a also provides two sets of electrically paralleled pins, only one of which is visible in FIG. 2a, and is designated 234a. A corresponding set on the other or non-visible side is merely a continuation of the pin set 234a. The conductor(s) associated with pin set 234a extend through the same region of the transducer as the conductor 222, and merely provide a corresponding path through the transducer which is available for mounting to a printed-circuit board. Whether the current to be sensed flows through the transducer by way of a conductor extending through aperture 232 or by way of pin set 234a, the transducer acts in a noncontacting manner, which is to say that there is no direct path (except possibly leakage paths) between the conductor carrying the current which is to be measured (either through aperture 232 or by way of pin set 234a) and the signal and power pins 236, 238, and 240.

It should be noted at this point that the term "between" and other terms such as "parallel" have meanings in an electrical context which differ from the meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

Figure 2B:
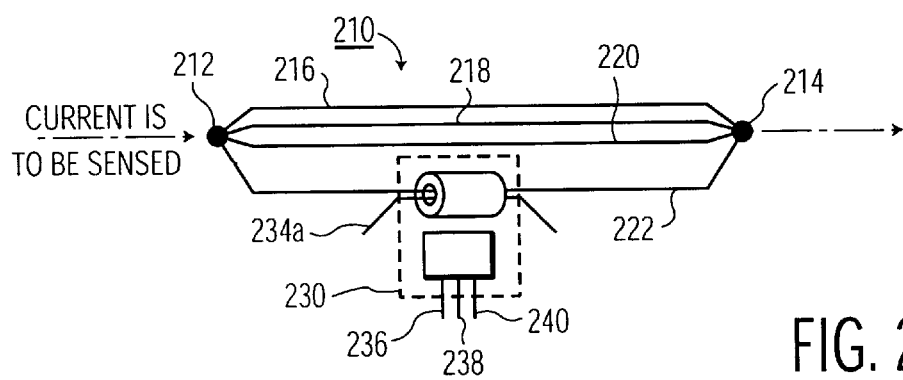
FIG. 2b is a schematic diagram thereof.

FIG. 2b is a schematic diagram illustrating the structure of the arrangement 210 of FIG. 2a. It will be seen that the electrical conductors 216, 218, 220, and 222 are electrically connected in parallel, which is to say that the current flowing between terminals or nodes 212 and 214 divides to flow through the various conductors in inverse proportion to their resistance. Since the four electrical conductors 216, 218, 220, and 222 are identical, identical currents flow through each wire, so long as the contact between the electrical conductors and the lugs 212, 214 is good. Consequently, the current flowing through electrical conductor 222 is only a fraction of the total current flowing between lugs 212 and 214, and the fractional portion is determinable. In the case illustrated in FIGS. 2a and 2b, the current in conductor 222 will be the total current divided by the total number of conductors extending between lugs 212 and 214. In the particular case, there are a total of four wires, so the current in conductor 222 will be the total current divided by four. For a maximum current to be sensed of 100 amperes, a four-wire arrangement such as that of FIGS. 2a and 2b would have 25 nominal amperes through the current sensor, which does not exceed its current rating. As described in conjunction with FIG. 5, the maximum measurable current may exceed 25 amperes. Naturally, if there were five conductors, the fraction of the lug-to-lug current which would flow in conductor 222 would be ⅕. If the lug-to-lug current were to be a maximum of 100 amperes, the current through the current transducer would be a maximum of 20 amperes, well within the rated current of the transducer, or alternatively the maximum current to be sensed might be 125 amperes for a 25-ampere rating of the transducer or sensor. Thus, a relatively inexpensive 25-ampere current transducer or sensor can be used to measure a current of 125 amperes.

More generally, additional paralleled electrical conductors or wires can be used to provide almost any desired current division ratio so as to maintain current through the transducer or sensor within its ratings while allowing many times that current through the entire circuit. Thus, a current with a maximum value of 1000 amperes, could be measured by 25-ampere rated transducer or sensor in the presence of a total of forty electrically paralleled conductors.

The arrangement of FIG. 2a has the advantage that all of the high-current conductors 216, 218, 220, and 222 are in the same environment, so that any air flow over their surfaces will tend to be the same, and the thermal conduction to the lugs should also be the same. Consequently, the temperature rise in each of the electrical conductors should be approximately equal. It is expected that any current-splitting deviation attributable to temperature differences will be small enough to not affect the performance.

Figure 3A:
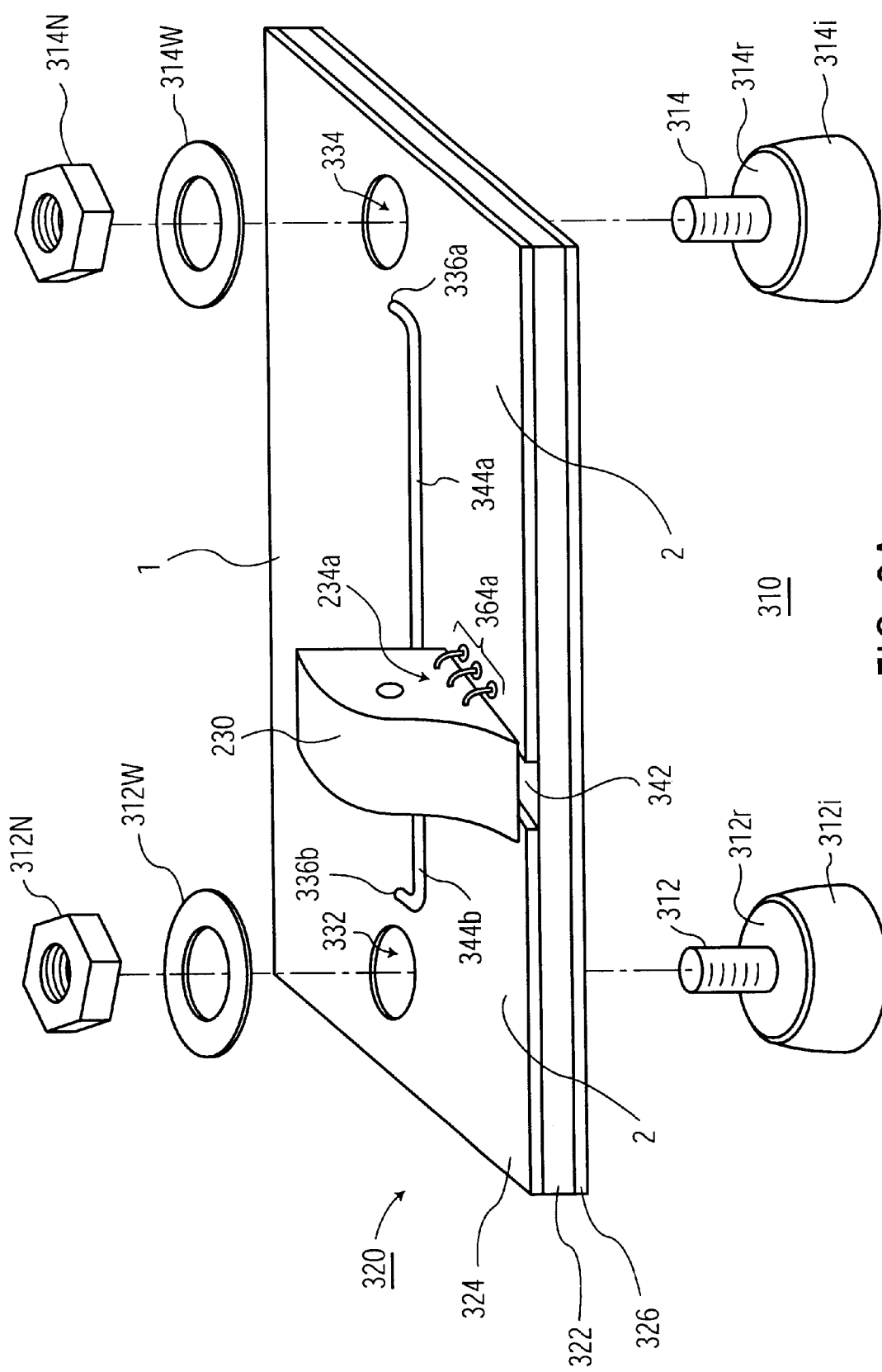
FIG. 3a is a simplified perspective or isometric view of a printed-circuit board assemblage usable in an aspect of the invention.

FIG. 3a is a simplified perspective or isomeric view of a printed-circuit current sensing assemblage according to an aspect of the invention. In FIG. 3a, an assemblage 310 includes a printed board assembly 320 and two connecting posts or terminals 312 and 314. Posts or terminals 312, 314 are the terminals between which the large electrical current which is to be sensed flows. Posts or terminals 312 and 314 each include an insulating support 312i, 314i, respectively, and an electrically conductive ring 312r, 314r, respectively, which is in electrical contact with its post or terminal.

Printed-circuit assemblage 320 of FIG. 3a includes a dielectric substrate 322, with patterned "printed circuit" conductors 324 and 326 on its upper and lower sides, respectively. As illustrated, substrate 322 defines first and second apertures 332 and 334 dimensioned to accept posts 312 and 314, respectively, for allowing rings 312r and 314r of posts 312 and 314 to make contact with the lower printed circuit conductor 326, and for allowing posts 312 and 314 to make electrical contact with upper printed conductor 324 with the aid of conductive washers 312w and 314w and nuts 312N, 314N. Thus, the upper printed conductor 324 and the lower printed conductor 326 are effectively in electrical parallel.

Figure 3B:
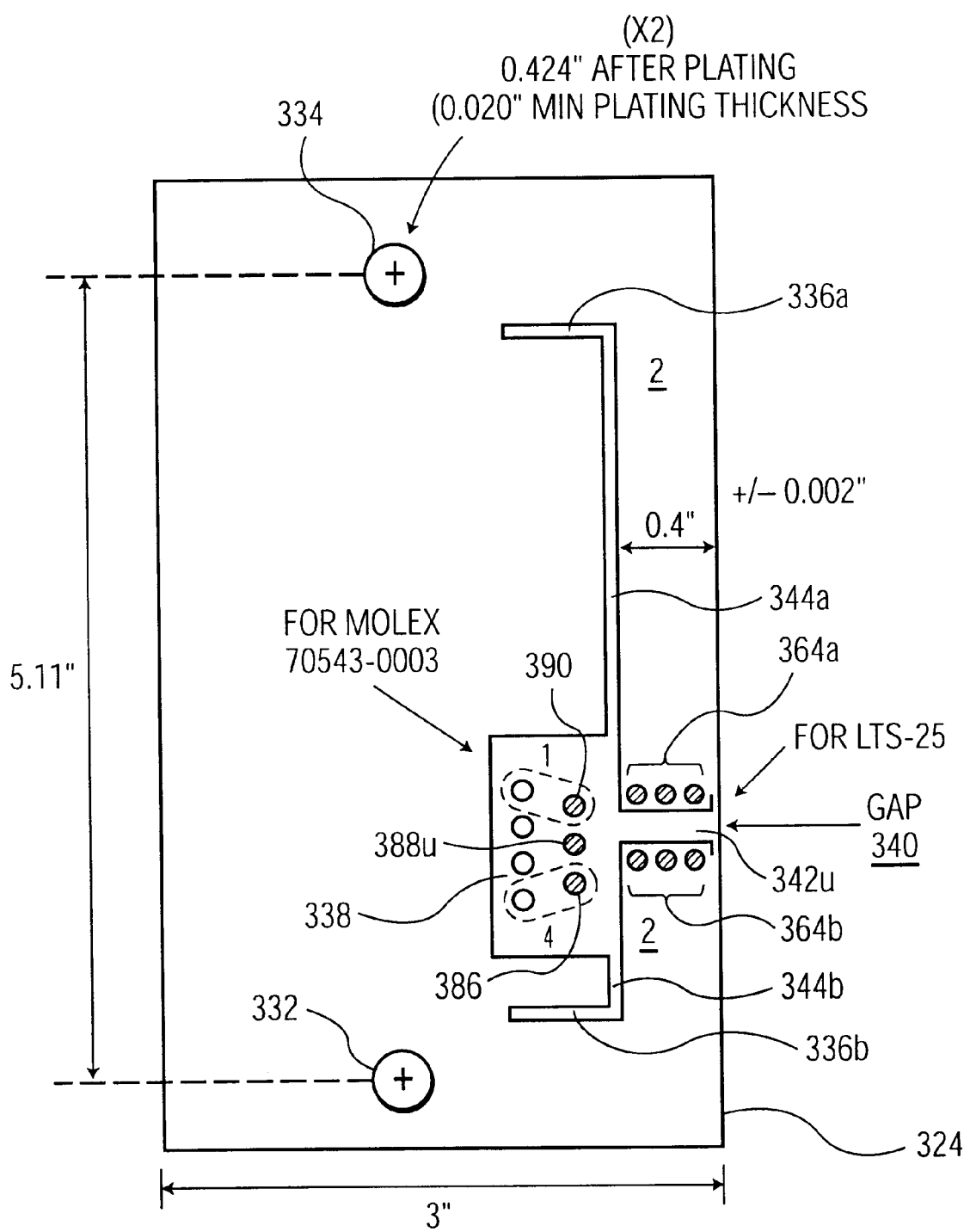

A printed gap pattern 340 is defined on the upper printed conductive surface 324 of printed circuit assemblage 320, as illustrated in FIGS. 3a and 3b. As illustrated, the gap 340 defines plural gap sections. The principal gap which appears on the conductive upper surface 324 divides the upper conductive surface 324 longitudinally into two conductive portions 1 and 2, where the term "longitudinally" refers to a direction extending from aperture 332 to aperture 334. These two electrical conductors are in electrical parallel as to current flowing from post 312 to post 314, much as the conductors 222 and 220 are in parallel in FIG. 2a. There is a difference between the situation in FIG. 2a and that of FIG. 2b, and that difference lies in the fact that the dimensions of the electrical conductors 1 and 2 are different from each other. This allows control of the relative current division by controlling the dimensions, rather than the number of, the paralleled conductors. More particularly, the printed-circuit board fabrication techniques result in a generally uniform conductor thickness, which may be, for example, 0.035 inch. Thus, the cross-sectional dimension of conductors 1 and 2 depends only on their widths. If the width of conductor 1 were, say, three times the width of conductor 2, its resistance would be one-third that of conductor 2. The current division could in that case be readily determined to be ⅓+1 or ¼, meaning that the current in conductor 2 would be ¼ of the total current flowing from post 312 to post 314.

The printed circuit upper pattern illustrated FIG. 3b includes an open or nonconductive region 338u, which is provided to accommodate the power and signal pins of the transducer and the pins or sockets of a connector allowing connection of an external cable to the printed circuit board for the purpose of energizing the transducer and coupling signal therefrom.

The printed-circuit arrangement described in conjunction with FIGS. 3a and 3b has the advantages of consistency from unit to unit, since they are fabricated by batch-like processing. In addition, the relatively flat morphology allows for relatively large heat dissipation in response to airflow over the large, flat surfaces. It further provides a convenient and inexpensive mounting for the current sensor or transducer 230. As illustrated in FIG. 3a, transducer 230 is mounted on the upper surface of printed circuit board 320, with its through three-pin set 234a extending into three apertures designated together as 364a and are soldered or otherwise electrically bonded to conductor 1. The corresponding portions of pin set 234a on that side of transducer 230 which is not visible in FIG. 3a extend into apertures designated 364b in conductor 1. As best illustrated in FIG. 3b, a portion 342u of gap 340 extends between aperture sets 364a and 364b, so as to prevent the direct flow of current, and so as to force any current flowing in conductor 1 to pass through the transducer 230 by way of its pin set 234a. Also, when transducer 230 is mounted in place as illustrated in FIG. 3a, its signal and power pins 236, 238 and 240 extend through apertures 386, 388, and 390, respectively, in board 320, and are soldered to conductors on the reverse side, for making appropriate connections. The presence of gap 342L on the reverse or underside of the board prevents the lower printed conductor 326 from short-circuiting the pins 364a of the transducer.

Figure 3C:
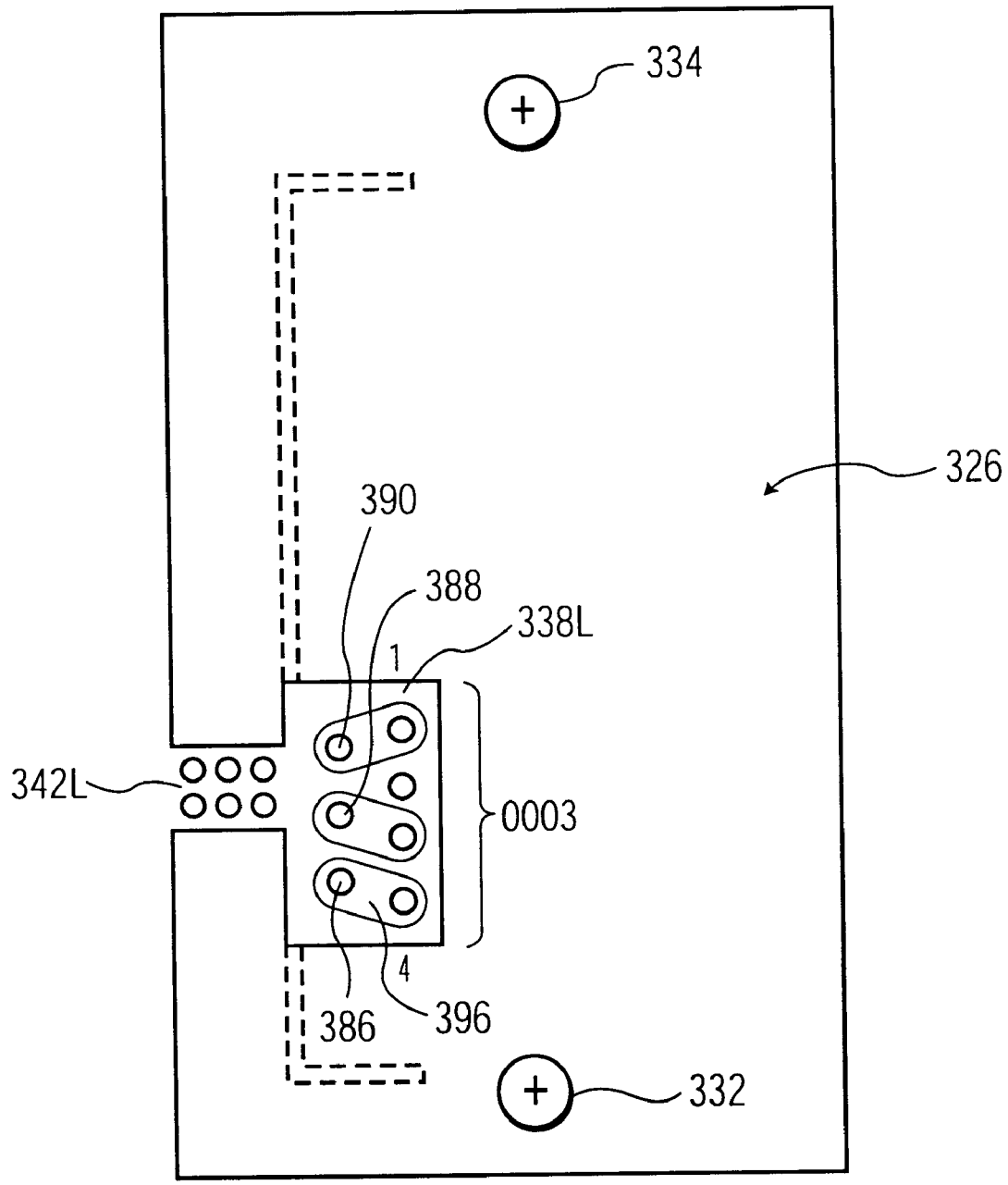

FIG. 3c illustrates a plan view of the underside of printed circuit board 320, showing the printed pattern thereon. The surface of conductive pattern 326 faces the viewer. As illustrated, the pattern defines an open area or region including a lower gap portion 342L and a portion 338L, which provides clearance for pins and conductors. Open or nonconductive portion 338L also includes three conductors which connect pins of the transducer to corresponding pins of a connector. As illustrated, pin 386 is connected by a conductor 396 to pin 4 of set 0003, pin 388 is connected by way of a conductor 398 to pin 3 of set 0003, and pin 390 is connected by way of a conductor 400 to pin 1 of set 0003. Pin 2 of set 0003 remains unconnected. The illustrated pin or socket set 0003 is arranged, in one embodiment of the invention, for connection of a MOLEX type 70543-0003 connector.

Figure 4:
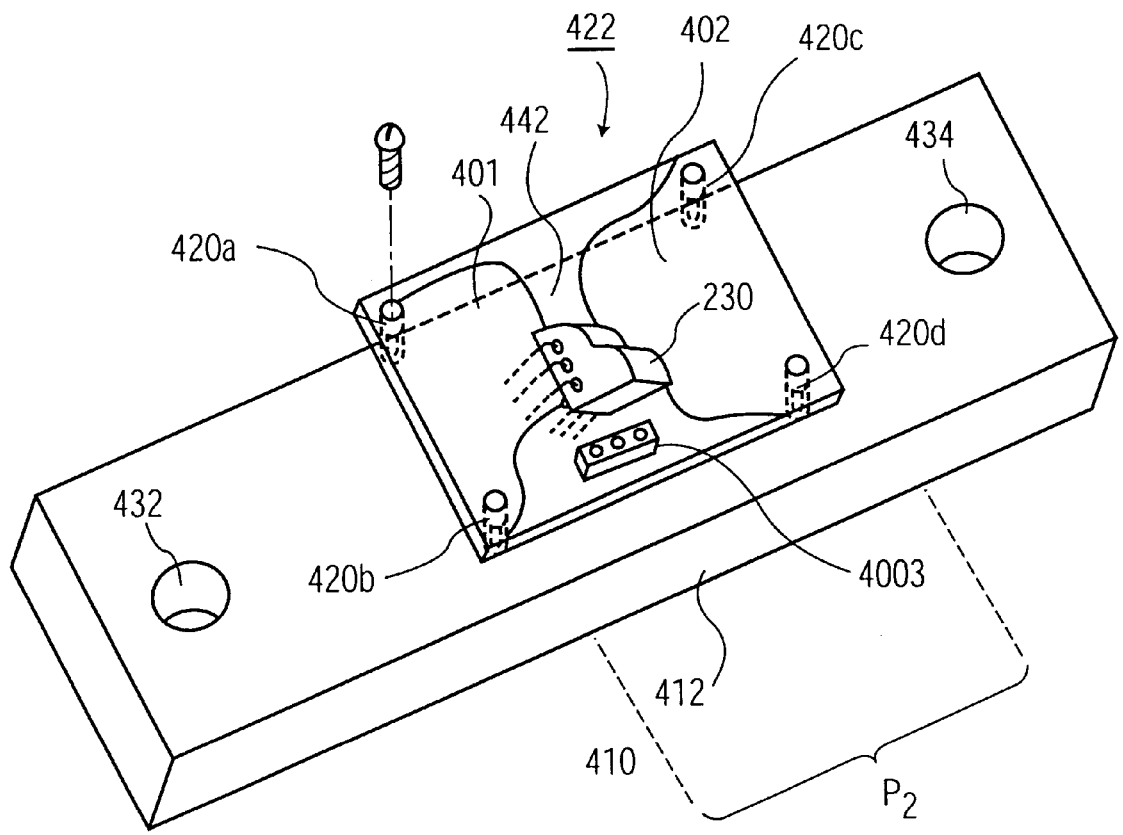
FIG. 4 is a simplified perspective or isometric view of a printed-circuit arrangement using an off-board shunting arrangement including a portion of a bus bar.

FIG. 4 is a perspective or isometric view of another current dividing current sensing arrangement 410 for use with a current sensor having rated range of current less than the maximum current to be sensed. In FIG. 4, an electrically conductive bus bar 412 defines two apertures 432, 434 dimensioned and spaced for connection to posts such as posts 312, 314 of FIG. 3a. Bus bar 412 supports four electrically conductive support posts 420a, 420b, 420c, and 420d. A printed-circuit board designated generally as 422 includes first and second mutually isolated conductive circuit portions 401 and 402 with a gap 442 therebetween.

Electrically conductive portion or pattern 401 is electrically connected to posts 420a and 420b, and electrically conductive portion 402 is electrically connected to posts 420c and 420d. A current-sensing transducer 230 is coupled across the gap 442 lying between the conductive patterns 401 and 402. Current transducer or sensor 230 senses the current flowing from conductor 401 to 402 (or vice versa). When properly powered, transducer 230 produces its sensed signal in response to the current being sensed at an output terminal or port (not illustrated in FIG. 4), from which the signal is coupled (by paths not illustrated) to a socket of MOLEX connector 4003. As a result of the layout of the arrangement of FIG. 4, electrically conductive portion 401 is connected to a part of bus bar 412 which is spaced in the direction of current flow between apertures 432 and 434 from the part of the bus bar to which conductive portion 402 is connected. As a result of this spacing, that portion of the bus bar 412 lying between the locations or transverse plane of posts 420a, 420b and the locations or transverse plane of posts 420c, 420d represents a shunt resistance which parallels the path extending from conductor 401 through the sensor 230 to conductor 402. As a result, sensor 230 senses a proportion of the total current flowing from aperture 432 to aperture 434 of bus bar 412.

Other embodiments of the invention will be apparent to those skilled in the art. For example, instead of a drive wheel, the rotational vehicle drive device 12 could be a gear, as in the context of a high-angle railway. It should be noted that the inductance of the various paralleled paths may need to be controlled or kept equal in the case in which the circuit impedances are low.

The increasing use of vehicles powered completely or in part by electric motors has created a need for measuring high currents in an inexpensive, reliable and convenient manner for digital motor control. Because the operating voltages of traction motors may be high, it is desirable that the motor current sensors be noncontacting. High-current sensors are commercially available, but tend to be large and costly. Thus, in general, according to an aspect of the invention, a noncontacting current sensor having a rated capacity significantly less than the motor (or other) current to be measured is coupled to an electrical conductor for sensing the current in that conductor. The electrical conductor is paralleled by one or more additional similar conductors, so that only a fraction or portion of the current to be measured flows through the conductor associated with the sensor. The current sensor elements may be mounted on a printed-circuit board, which supports the elements, and also has one or more printed patterns which define a conductor associated with the sensor and at least one other conductor through which current can flow in parallel with the current in the sensor.

More particularly, a device (210, 310, 410) for determining electrical current according to an aspect of the invention includes a current sensing apparatus (230). The current sensing apparatus (230) includes a first electrical path (232; 234a) through which a current to be sensed ($I_s$) passes. The current sensing apparatus (230) is capable of producing a sensed signal in response to the current in the first electrical path (232: 234a), up to a predetermined maximum value of the current in the first electrical path (232: 234a), above which maximum value of current the sensed signal is limited. First (212, 312, 432) and second (214, 314, 434) terminals are coupled to ends of the first electrical path (232: 234a), whereby, or as a result of which, the current sensing apparatus (230) produces the sensed signal in response to current flowing between the first (212, 312, 432) and second (214, 314, 434) terminals at least up to the predetermined maximum value. The device (210, 310, 410) further includes a second electrical path ($P_2$,1,) extending between the first and second terminals. The second electrical path ($P_2$,1,) is effectively in electrical parallel with the first electrical path (232: 234a), so that a portion of current flowing between the first (212, 312, 432) and second (214, 314, 434) terminals flows through the second electrical path ($P_2$,1) rather than through the first electrical path (232: 234a). As a result of this division, the unlimited portion of the sensed signal represents a current between the first and second terminals which is greater than the current above which the current sensing apparatus (230) limits. In a particularly advantageous embodiment of the invention, the current sensing apparatus (230) is noncontacting as between the first current sensing path (232, 234a) and that port (at least one of pins 236, 238, and 240) at which the sensed signal is generated.

According to another aspect of the invention, a vehicle (10) is powered at least in part by an electric motor (16). The vehicle (10) comprises a rotational vehicle (10) drive device such as a wheel (12) or a cog. A motor (16) is coupled to the rotational vehicle (10) drive device, for driving the vehicle (10) when the motor (16) drives the rotational vehicle (10) drive device (12). The vehicle (10) also includes a source (18) of electrical energy; in the context of a purely electrically driven vehicle (10), this might be the traction battery, or in the context of a hybrid electric vehicle (10), it might include the traction battery, a generator, or both. An electrical power path (20, 210) extends between the source (18) of electrical energy and the motor (16). The electrical power path (20, 210, 16/1) includes a controllable electrical power control arrangement (20), for controllably coupling electrical energy between the source (18) of electrical energy and the motor (16). In an FOC system, the controllable electrical power control arrangement (20) may be a set of power switches operated by a digital controller (22). In a direct-current system, the power controller (20) might be as simple as a rheostat. A control circuit (22) is coupled to the controllable electrical power control arrangement (20), for responding to at least operator control signals (from block 24) and motor (16) current signals, for controlling the motor (16) for driving the vehicle (10) under operator control. A current sensing apparatus (230) is located in the electrical power path, for sensing at least a portion of one component (one phase, for example) of motor (16) current. In the context of a simple direct voltage source and motor (16), the main motor (16) current is sensed, while in the context of FOC control, all the motor (16) currents but one are sensed. The current sensing apparatus (230) has a maximum rated sensed current or maximum motor (16) current component for which a nonlimited sensed signal representative of the motor (16) current component is generated. A resistive shunt ($P_2$,1) parallels the current sensing apparatus (230), for shunting at least a portion of the motor (16) current component around the current sensing apparatus (230). In one embodiment of this version, the resistive shunt ($P_2$,1) comprises a multistrand electrically conductive cable. In another embodiment of this version, the resistive shunt ($P_2$,1) comprises at least a portion ($P_2$) of a bus bar (412). In yet another embodiment of this version, the current sensor (210, 310, 410) includes a printed-circuit board (320) including an electrically conductive path (2) broken at a break location (342), together with a commercial current sensor (230) coupled across the break (342) in the electrically conductive current path (2), for generating the sensed signal representative of the motor (16) current component; in this embodiment, the resistive shunt comprises a further electrically conductive portion (1) of the printed-circuit board (320). In a preferred embodiment of this version, the current sensing apparatus (230) is a noncontacting current sensing apparatus (230).

According to another aspect of the invention, an arrangement for determining electrical current (210, 310, 410) comprises a current sensing apparatus (230). The current sensing apparatus (230) includes a first electrical path (232: 234a) through which a current to be sensed passes. The current sensing apparatus (230) is capable of producing a sensed signal at a sensed signal port (one of 236, 238, and 240) in response to the current in the first electrical path (232: 234a), up to a rated maximum value of the current in the first electrical path (232: 234a). In this aspect of the invention, first (212, 312, 432) and second (214, 314, 434) terminals or electrodes are coupled to ends of the first electrical path (232: 234a), whereby the current sensing apparatus (230) produces the sensed signal in response to current flowing between the first and second terminals or electrodes. A second electrical path ($P_2,1$) extends between the first (212, 312, 432) and second (214, 314, 434) terminals, so that the second electrical path ($P_2,1$) is effectively in parallel with the first electrical path (232: 234a). As a result of these arrangements, a portion of the current flowing between the first (212, 312, 432) and second (214, 314, 434) terminals flows through the second electrical path ($P_2,1$) rather than through the first electrical path (232: 234a), whereby the total current flowing between the first (212, 312, 432) and second (214, 314, 434) terminals is greater than the current flowing in the first electrical path (232: 234a), whereby the current sensing apparatus (230) senses less than the total current flowing between the first (212, 312, 432) and second (214, 314, 434) terminals. In a particularly advantageous version of this aspect of the invention, the current sensing apparatus (230) is noncontacting as between the first electrical path (232: 234a) and sensed signal port (one of 236, 238, and 240).

What is claimed is:

1. A device for determining electrical current, said device comprising;
    a current sensing apparatus, said current sensing apparatus including a first electrical path through which a current to be sensed passes, said current sensing apparatus being capable of producing a sensed signal in linear response to the current in said first electrical path, up to a predetermined maximum value of said current in said first electrical path, above which current said sensed signal is limited;
    first and second terminals coupled to ends of said first electrical path, whereby said current sensing apparatus produces said sensed signal in response to current flowing between said first and second terminals up to said predetermined maximum value; and
    a second electrical path extending between said first and second terminals, said second electrical path being effectively in parallel with said first electrical path, so that a portion of current flowing between said first and second terminals flows through said second electrical path rather than through said first electrical path, whereby the non-limited portion of said sensed signal represents a current between said first and second terminals which is less than said current above which said sensed signal is limited, and whereby said device may be used to provide a signal indicative of the magnitude of said current flowing between said first and second terminals.

2. A device according to claim 1, wherein said current sensing apparatus is noncontacting as between said first current sensing path and that port at which said sensed signal is generated.

3. A vehicle powered at least in part by an electric motor, said vehicle comprising:
    a rotational vehicle drive device;
    a motor coupled to said rotational vehicle drive device, for driving said vehicle when said motor drives said rotational vehicle drive device;
    a source of electrical energy;
    an electrical power path extending between said source of electrical energy and said motor, said electrical power path including a controllable electrical power control arrangement, for controllably coupling electrical energy between said source of electrical energy and said motor;
    a control circuit coupled to said controllable electrical power control arrangement, for responding to at least operator control signals and motor current signals, for controlling said motor for driving said vehicle under operator control;
    a current sensing apparatus located in said electrical power path, for sensing at least one component of motor current, said current sensing apparatus having a maximum motor current component below which a nonlimited sensed signal linearly representative of said motor current component is generated and above which said sensed signal is limited; and
    a resistive shunt paralleling said current sensing apparatus, for shunting at least a portion of said motor current component around said current sensing apparatus.

4. A vehicle according to claim 3, wherein said resistive shunt comprises a multistrand electrically conductive cable.

5. A vehicle according to claim 3, wherein said resistive shunt comprises at least a portion of a bus bar.

6. A vehicle according to claim 3, wherein said current sensing apparatus includes a printed-circuit board including an electrically conductive path broken at a break location; and
    a commercial current sensor coupled across said break in said current path, for generating said sensed signal representative of said motor current component; and wherein
    said resistive shunt comprises a further electrically conductive portion of said printed-circuit board.

7. A vehicle according to claim 3, wherein said current sensing apparatus is a noncontacting current sensing apparatus.

8. An arrangement for determining electrical current, said arrangement comprising;
    a current sensing apparatus, said current sensing apparatus including a first electrical path through which a current to be sensed passes, said current sensing apparatus being capable of producing a sensed signal at a sensed signal port in linear response to the current in said first electrical path, at least up to a maximum value of said current in said first electrical path;
    first and second terminals coupled to ends of said first electrical path, whereby said current sensing apparatus produces said sensed signal in response to current flowing between said first and second terminals; and
    a second electrical path extending between said first and second terminals, said second electrical path being effectively in parallel with said first electrical path, so that a portion of the current flowing between said first and second terminals flows through said second electrical path rather than through said first electrical path, whereby the total current flowing between said first and second terminals is greater than the current flowing in said first electrical path, whereby said current sensing apparatus senses less than the total current flowing between said first and second terminals.

9. An arrangement according to claim 8, wherein said current sensing apparatus is noncontacting as between said first electrical path and sensed signal port.

* * * * *